United States Patent
Liao et al.

(10) Patent No.: US 8,574,990 B2
(45) Date of Patent: Nov. 5, 2013

(54) METHOD OF MANUFACTURING SEMICONDUCTOR DEVICE HAVING METAL GATE

(75) Inventors: Po-Jui Liao, Taichung (TW); Tsung-Lung Tsai, Tai-Nan (TW); Chien-Ting Lin, Hsinchu (TW); Shao-Hua Hsu, Taoyuan County (TW); Shui-Yen Lu, Hsinchu County (TW); Pei-Yu Chou, Tainan (TW); Shin-Chi Chen, Tainan (TW); Jiunn-Hsiung Liao, Tainan (TW); Shang-Yuan Tsai, Kaohsiung (TW); Chan-Lon Yang, Taipei (TW); Teng-Chun Tsai, Tainan (TW); Chun-Hsien Lin, Tainan (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 233 days.

(21) Appl. No.: 13/033,616

(22) Filed: Feb. 24, 2011

(65) Prior Publication Data
US 2012/0220113 A1 Aug. 30, 2012

(51) Int. Cl.
*H01L 21/00* (2006.01)

(52) U.S. Cl.
USPC .......................................... 438/275; 438/589

(58) Field of Classification Search
USPC .................................... 438/275–278
See application file for complete search history.

(56) References Cited

U.S. PATENT DOCUMENTS

| | | | |
|---|---|---|---|
| 6,033,963 A | 3/2000 | Huang | |
| 6,096,659 A | 8/2000 | Gardner | |
| 6,121,155 A * | 9/2000 | Yang et al. | ........... 438/725 |
| 6,162,694 A | 12/2000 | Cheek | |
| 6,171,910 B1 | 1/2001 | Hobbs | |
| 6,406,956 B1 | 6/2002 | Tsai | |
| 6,524,901 B1 | 2/2003 | Trivedi | |
| 6,617,209 B1 | 9/2003 | Chau | |
| 6,617,210 B1 | 9/2003 | Chau | |
| 6,653,698 B2 | 11/2003 | Lee | |
| 6,656,764 B1 | 12/2003 | Wang | |
| 6,689,675 B1 | 2/2004 | Parker | |
| 6,696,327 B1 | 2/2004 | Brask | |
| 6,696,333 B1 | 2/2004 | Zheng | |
| 6,709,911 B1 | 3/2004 | Doczy | |
| 6,713,358 B1 | 3/2004 | Chau | |
| 6,716,707 B1 | 4/2004 | Brask | |
| 6,770,568 B2 | 8/2004 | Brask | |
| 6,787,440 B2 | 9/2004 | Parker et al. | |
| 6,797,622 B2 | 9/2004 | Brask | |
| 6,806,146 B1 | 10/2004 | Brask | |
| 6,830,953 B1 | 12/2004 | Hu | |
| 6,858,483 B2 | 2/2005 | Doczy | |
| 6,867,102 B2 | 3/2005 | Brask | |

(Continued)

*Primary Examiner* — Richard Booth
(74) *Attorney, Agent, or Firm* — Winston Hsu; Scott Margo

(57) ABSTRACT

The present invention provides a method of manufacturing semiconductor device having metal gate. First, a substrate is provided. A first conductive type transistor having a first sacrifice gate and a second conductive type transistor having a second sacrifice gate are disposed on the substrate. The first sacrifice gate is removed to form a first trench and then a first metal layer and a first material layer are formed in the first trench. Next, the first metal layer and the first material layer are flattened. The second sacrifice gate is removed to form a second trench and then a second metal layer and a second material layer are formed in the second trench. Lastly, the second metal layer and the second material layer are flattened.

20 Claims, 11 Drawing Sheets

(56) References Cited

U.S. PATENT DOCUMENTS

| | | |
|---|---|---|
| 6,879,009 B2 | 4/2005 | Zheng |
| 6,887,800 B1 | 5/2005 | Metz |
| 6,897,134 B2 | 5/2005 | Brask |
| 6,900,481 B2 | 5/2005 | Jin |
| 6,914,313 B2 | 7/2005 | Wang |
| 6,921,711 B2 | 7/2005 | Cabral, Jr. |
| 6,939,815 B2 | 9/2005 | Brask |
| 6,949,769 B2 | 9/2005 | Hu |
| 6,953,719 B2 | 10/2005 | Doczy |
| 6,960,416 B2 | 11/2005 | Mui |
| 6,967,131 B2 | 11/2005 | Saenger |
| 6,972,225 B2 | 12/2005 | Doczy |
| 7,029,966 B2 | 4/2006 | Amos |
| 7,045,428 B2 | 5/2006 | Brask |
| 7,056,794 B2 | 6/2006 | Ku |
| 7,064,050 B2 | 6/2006 | Cabral, Jr. |
| 7,064,066 B1 | 6/2006 | Metz |
| 7,112,851 B2 | 9/2006 | Saenger |
| 7,126,199 B2 | 10/2006 | Doczy |
| 7,138,323 B2 | 11/2006 | Kavalieros |
| 7,144,783 B2 | 12/2006 | Datta |
| 7,148,099 B2 | 12/2006 | Datta |
| 7,148,548 B2 | 12/2006 | Doczy |
| 7,153,734 B2 | 12/2006 | Brask |
| 7,153,784 B2 | 12/2006 | Brask |
| 7,157,378 B2 | 1/2007 | Brask |
| 7,160,767 B2 | 1/2007 | Brask |
| 7,163,853 B2 | 1/2007 | Tu |
| 7,166,505 B2 | 1/2007 | Chau |
| 7,176,090 B2 | 2/2007 | Brask |
| 7,176,537 B2 | 2/2007 | Lee |
| 7,183,184 B2 | 2/2007 | Doczy |
| 7,192,890 B2 | 3/2007 | Zhou |
| 7,196,856 B2 | 3/2007 | Nakamura |
| 7,208,361 B2 | 4/2007 | Shah |
| 7,217,611 B2 | 5/2007 | Kavalieros |
| 7,220,365 B2 | 5/2007 | Qu |
| 7,271,045 B2 | 9/2007 | Prince |
| 7,271,083 B2 | 9/2007 | Tu |
| 7,285,829 B2 | 10/2007 | Doyle |
| 7,316,949 B2 | 1/2008 | Doczy |
| 7,317,231 B2 | 1/2008 | Metz |
| 7,326,610 B2 | 2/2008 | Amos |
| 7,332,439 B2 | 2/2008 | Lindert |
| 7,355,281 B2 | 4/2008 | Brask |
| 7,365,015 B2 | 4/2008 | Lin |
| 7,381,608 B2 | 6/2008 | Brask |
| 7,384,880 B2 | 6/2008 | Brask |
| 7,387,927 B2 | 6/2008 | Turkot, Jr. |
| 7,390,709 B2 | 6/2008 | Doczy |
| 7,393,766 B2 | 7/2008 | Wang |
| 7,422,936 B2 | 9/2008 | Barns |
| 7,425,490 B2 | 9/2008 | Kavalieros |
| 7,439,113 B2 | 10/2008 | Doczy |
| 7,531,404 B2 | 5/2009 | Pae |
| 7,569,443 B2 | 8/2009 | Kavalieros |
| 7,595,248 B2 | 9/2009 | Hattendorf |
| 2003/0166329 A1* | 9/2003 | Chen et al. .................... 438/570 |
| 2006/0008954 A1 | 1/2006 | Kavalieros |
| 2007/0029627 A1 | 2/2007 | Datta |
| 2007/0037372 A1* | 2/2007 | Kavalieros et al. ........... 438/585 |
| 2007/0040227 A1 | 2/2007 | Datta |
| 2007/0141798 A1 | 6/2007 | Bohr |
| 2007/0262451 A1* | 11/2007 | Rachmady et al. ........... 257/758 |
| 2009/0039433 A1 | 2/2009 | Yang |
| 2009/0087974 A1* | 4/2009 | Waite et al. ................... 438/592 |
| 2009/0186458 A1 | 7/2009 | Yu |
| 2010/0044783 A1 | 2/2010 | Chuang |
| 2010/0052066 A1 | 3/2010 | Yu |
| 2010/0065926 A1 | 3/2010 | Yeh |
| 2010/0068877 A1 | 3/2010 | Yeh |
| 2010/0327365 A1* | 12/2010 | Iwamoto ....................... 257/369 |
| 2011/0248359 A1* | 10/2011 | Hwang et al. ................. 257/410 |
| 2012/0070995 A1 | 3/2012 | Wang |

* cited by examiner

METHOD OF MANUFACTURING SEMICONDUCTOR DEVICE HAVING METAL GATE

BACKGROUND OF THE INVENTION

1. Field of the Invention

The present invention relates to a method of manufacturing a semiconductor device having a metal gate.

2. Description of the Prior Art

Poly-silicon is conventionally used as a gate electrode in semiconductor devices, such as the metal-oxide-semiconductor (MOS). However, with a trend toward scaling down the size of semiconductor devices, the conventional poly-silicon gate has faced problems such as inferior performance due to boron penetration and unavoidable depletion effect which increases equivalent thickness of the gate dielectric layer, reduces gate capacitance, and worsens a driving force of the devices. Therefore, work function metals are used to replace the conventional poly-silicon gate to be the control electrode that are suitable for use as the high-K gate dielectric layer.

In a complementary metal-oxide semiconductor (CMOS) device, one of the dual work function metal gates is used in an NMOS device and the other one is alternatively used in a PMOS device. It is well-known that compatibility and process control for the dual metal gate are more complicated, meanwhile thickness and composition controls for materials used in the dual metal gate method are more precise. The conventional dual metal gate methods are categorized into gate first process and gate last process. In a conventional dual metal gate method applied with the gate first process, the anneal process for forming the source/drain ultra-shallow junction, and the silicide process are performed after forming the metal gate. After the anneal process having such strict heat budget, it is found that a flat band voltage (Vfb) does not increase or decrease linearly with decrease of EOT of the high-K gate dielectric layer. Instead, a roll-off issue is observed. Therefore, the gate last process is developed to improve the Vfb roll-off issue and avoid generating leakage current due to re-crystallization of the high-K gate dielectric layer happened in high-temperature processes, and to widen material choices for the high-K gate dielectric layer and the metal gate in the gate first process.

In the conventional gate last process, a sacrifice gate or a replacement gate is provided and followed by performing processes used to construct a normal MOS transistor. Then, the sacrifice/replacement gate is removed to form a gate trench. Consequently, the gate trench is filled with metals according to the different electrical requirements. However, because of the complicated steps of the gate last processes, the manufacturers are devoted to simplify the manufacturing process.

SUMMARY OF THE INVENTION

The present invention therefore provides a method of manufacturing a semiconductor device with a better reliability.

According to one embodiment of the present invention, a method of manufacturing semiconductor device having metal gate is provided. First, a substrate is provided. A first conductive type transistor having a first sacrifice gate and a second conductive type transistor having a second sacrifice gate are disposed on the substrate. The first sacrifice gate is removed to form a first trench and then a first metal layer and a first material layer are formed in the first trench. Next, the first metal layer and the first material layer are flattened. The second sacrifice gate is removed to form a second trench and then a second metal layer and a second material layer are formed in the second trench. Lastly, the second metal layer and the second material layer are flattened.

The present invention uses organic materials as the first material layer or the second material layer, so a better filling result and a reliable CMP process can be provided. In addition, the present invention further provides special processes to form the first trench and the second trench such that the reliability of process can be raised.

These and other objectives of the present invention will no doubt become obvious to those of ordinary skill in the art after reading the following detailed description of the preferred embodiment that is illustrated in the various FIGS. and drawings.

DETAILED DESCRIPTION

Figure 1:
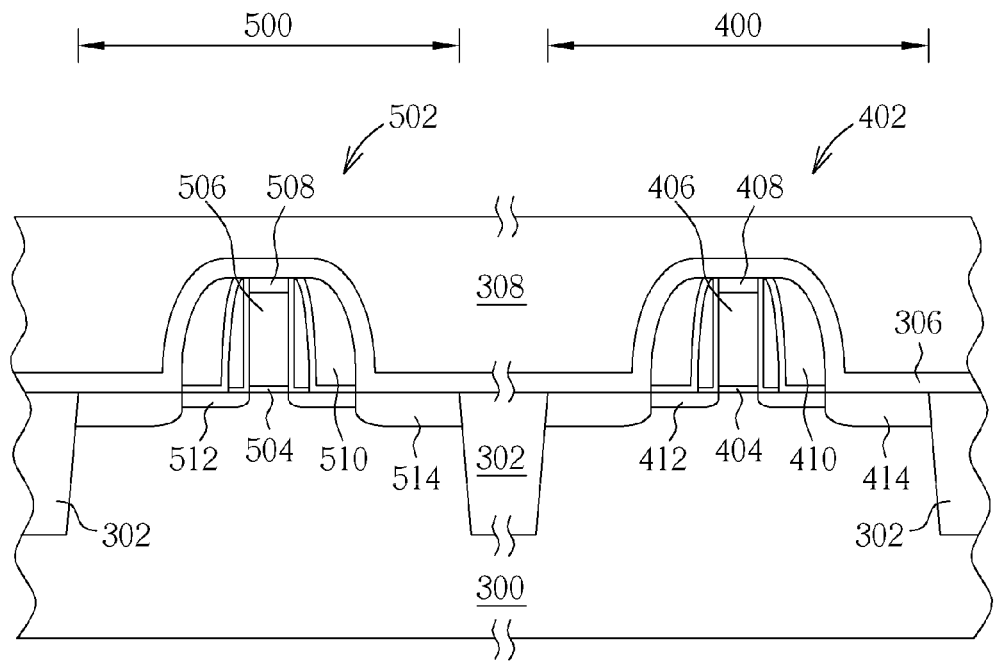
FIG. 1 to FIG. 12 illustrate the schematic diagrams of the method of manufacturing the semiconductor device having metal gate according to the first embodiment of the present invention.

To provide a better understanding of the presented invention, preferred embodiments will be made in detail. The preferred embodiments of the present invention are illustrated in the accompanying drawings with numbered elements.

Please refer to FIG. 1 to FIG. 12, illustrating the schematic diagrams of the method of manufacturing the semiconductor device having metal gate according to the first embodiment of the present invention. First, a substrate 300 is provided, such as a silicon substrate, a silicon-containing substrate or a silicon-on-insulator (SOI) substrate. A plurality of shallow trench isolations (STI) 302 are disposed on the substrate 300. According to the areas encompassed by the STI 302, a first active region 400 and a second active region 500, which are insulated from each other, are defined on the substrate 300. Then, a first conductive type transistor 402 and a second conductive type transistor 502 are formed on the substrate 300 respectively in the first active region 400 and the second active region 500. In one preferred embodiment of the present invention, the first conductive type transistor 402 is a P-type transistor, while the second conductive type transistor 502 is an N-type transistor. However, those skilled in the art would easily realize that it is not limited to have the first conductive-type transistor 402 being an N-type transistor and the second conductive-type transistor 502 being a P-type transistor.

As shown in FIG. 1, the first conductive type transistor 402 includes a first gate dielectric layer 404, a first sacrifice gate 406, a first capping layer 408, a first spacer 410, a first light doped drain (LDD) 412 and a first source/drain 414. In one preferred embodiment of the present invention, the first gate dielectric layer 404 can be a $SiO_2$ layer or a high-K gate dielectric layer. The high-k gate dielectric layer includes silicon nitride (SiN), silicon oxynitride (SiON) or metal oxide. The metal oxide includes rare earth metal oxide, such as hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), lanthanum aluminum oxide (LaAlO), tantalum oxide ($Ta_2O_5$), zirconium oxide ($ZrO_2$), zirconium silicon oxide ($ZrSiO_4$), hafnium zirconium oxide (HfZrO), strontium bismuth tantalite ($SrBi_2Ta_2O_9$, SBT), lead zirconate titanate ($PbZr_xTi_{1-x}O_3$, PZT) or barium strontium titanate ($Ba_xSr_{1-x}TiO_3$, BST), but is not limited thereto. The first gate dielectric layer 404 may be single layer or a multi layer and preferably includes a $SiO_2$ layer and a high-k dielectric layer from bottom to top. In one embodiment, the first sacrifice gate 406 is a poly-silicon gate. In another embodiment, the first sacrifice gate 406 is a multi-layered gate including a poly-silicon layer, an amorphous silicon layer or a germanium layer. In another embodiment, the sacrifice gate 406 may include an inclined sidewall, thereby forming an "up-large-bottom-small" structure. A barrier layer or an etch stop layer can be optionally formed between the first gate dielectric layer 404 and the first sacrifice gate 406, for instance, a SiN layer or a metal nitride layer such as TiN or TaN. The first capping layer 408 is an optional layer including SiN layer, $SiO_2$ or their combination for example. The first spacer 410 can be a multilayered structure including high temperature oxide (HTO), SiN, SiO or SiN formed by hexachlorodisilane ($Si_2Cl_6$) (HCD-SiN). In one embodiment, the first spacer 410 can be partially or completely removed to produce a desired stress of the contact etch stop layer (CESL) 306 toward the first conductive type transistor 402 and the second conductive type transistor 502. The first LDD 412 and the first source/drain 414 are formed by appropriate implant doping.

The second conductive type transistor 502 includes a second gate dielectric layer 504, a second sacrifice gate 506, a second capping layer 508, a second spacer 510, a second LDD 512 and a second source/drain 514. The embodiment of each component in the second conductive type transistor 502 is similar to that of the first conductive type transistor 402 and is not described repeatedly. In addition, the first conductive type transistor 402 and the second conductive type transistor 502 can further include other semiconductor structures which are not explicitly shown in FIG. 1, such as a silicide layer, a source/drain having an hexagon (also called sigma Σ) or octagon shaped cross-section which is formed by selective epitaxial growth (SEG), or other protective films. After forming the first conductive type transistor 402 and the second conductive type transistor 502, a contact etch stop layer (CESL) 306 and an inter-layer dielectric (ILD) layer 308 are formed on the substrate 300 to cover the first conductive type transistor 402 and the second conductive type transistor 502. In one embodiment, the CESL 306 can generate a stress to form a selective strain scheme (SSS) wherein a compressing force is applied on the first conductive type electrode 402 and a straining force is applied on the second conductive type electrode 502.

Figure 2:
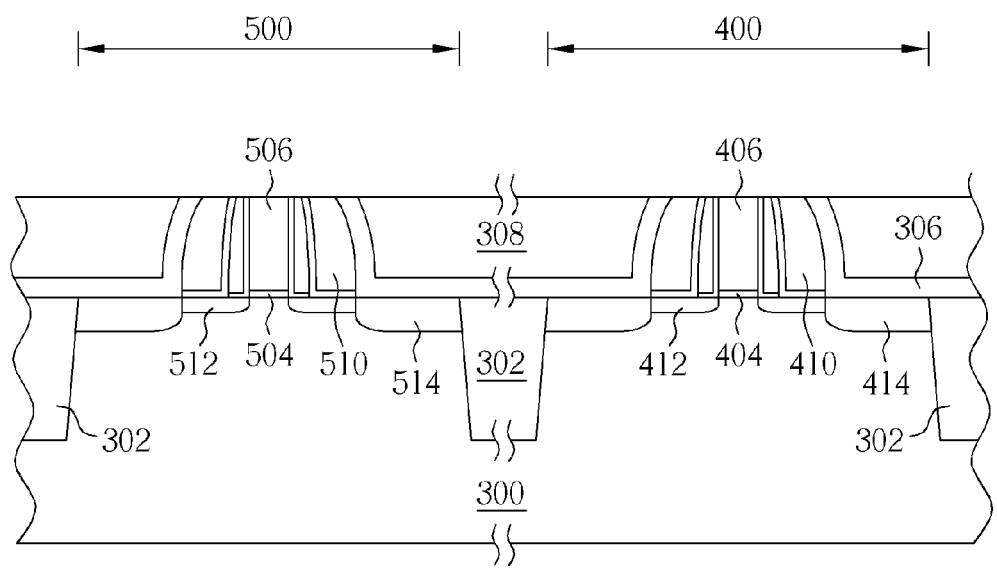

As shown in FIG. 2, a planarization process, such as a chemical mechanical polish (CMP) process or an etching-back process or their combination is performed to remove a part of the ILD layer 308, a part of the CESL 306, a part of the first spacer 410, a part of the second spacer 510, and completely remove the first capping layer 408 and the second capping layer 508, until the top surface of the first sacrifice gate 406 and the second sacrifice gate 506 are exposed.

Figure 3:
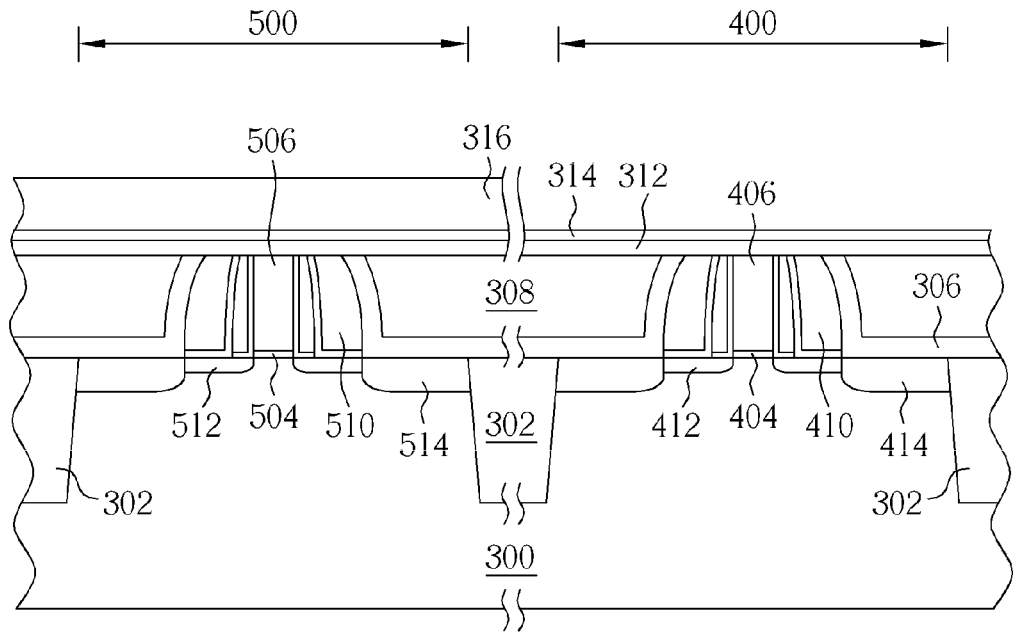

As shown in FIG. 3, a mask layer 312 and an optional auxiliary layer 314 are formed on the substrate 300. In one preferred embodiment of the present invention, the mask layer 312 is a TiN layer, and the auxiliary layer 314 is a $SiO_2$ layer. The auxiliary layer 314 can provide a better adhesion force toward the first patterned photoresist layer 316 formed in the follow-up step. The thickness of the mask layer 312 is about 60 A~150 A (angstrom), preferably 100 A, and the thickness of the auxiliary layer 314 is about 15 A~50 A, preferably 20 A. Then, a first patterned photoresist layer 316 is formed on the substrate 300 to cover at least the second active region 500.

Figure 6:
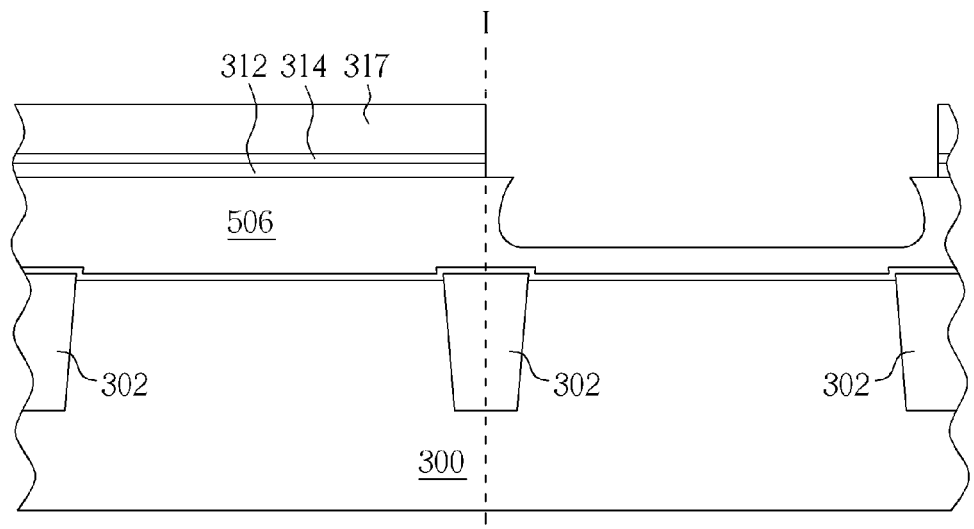
Figure 7A:
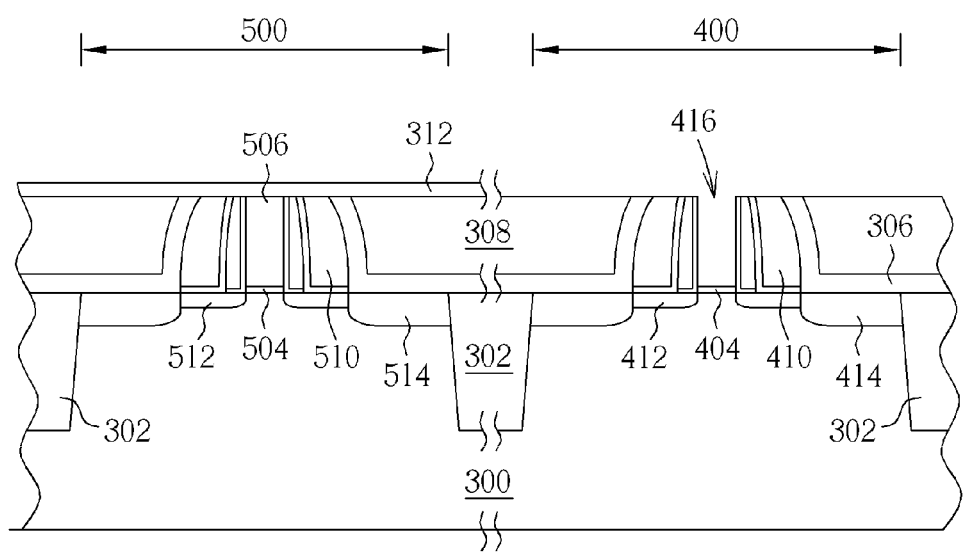
Figure 7B:
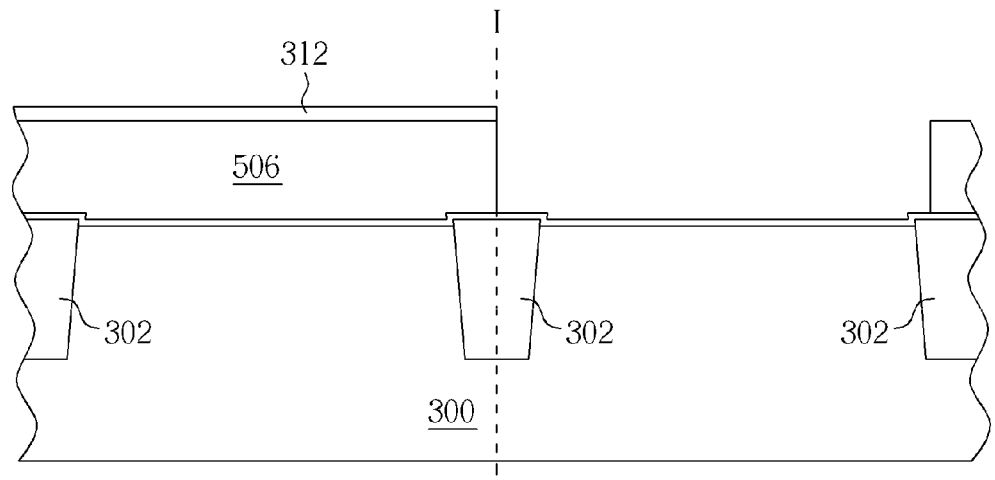

Subsequently, the first patterned photoresist layer 316 is used as mask to remove a portion of the mask layer 312, the auxiliary layer 314 and the first sacrifice gate 406 not covered by the first patterned photoresist layer 316. The above steps are accomplished by patterning the mask layer 312 and then using the patterned mask layer 312 as a mask to remove the first sacrifice gate 406. However, due the material used for the first sacrifice gate 406 includes poly-silicon, though the wet etching process having a better etching selectivity can stop on the first gate dielectric layer 404, it is easy for the under-cut phenomenon to occur when using the mask layer 312 as a mask to remove the below poly-silicon. Such problems are more likely to occur in forming other semiconductor structures, such as a SRAM with a poly-silicon interface between the gate of PMOS and the gate of the NMOS. On the contrary, the dry etching step can avoid under-cut phenomenon but can not stop on the first gate dielectric layer 404, leading to over etching problem. Therefore, one embodiment of the present invention is to perform a dry etching process first to remove the large part of the first sacrifice gate 406 and then perform a wet etching process to thoroughly remove the first sacrifice gate 406 and stop on the first gate dielectric layer 404. In another embodiment, please refer to FIG. 4a, 4b to FIG. 7a, 7b, wherein FIG. 4b and FIG. 7b show a semiconductor structure having a poly-silicon gate interface between PMOS and NMOS. FIG. 4b and FIG. 7b represent the cross-sectional view of FIG. 4a and FIG. 7a, respectively, and the cross line corresponds to the second sacrifice gate 506. The dashed line I in FIG. 4b and FIG. 7b represents the position of the poly-silicon gate interface. The right part of the dashed line I represents a P-type transistor while the left part of the dashed line I represents an N-type transistor.

Figure 4A:
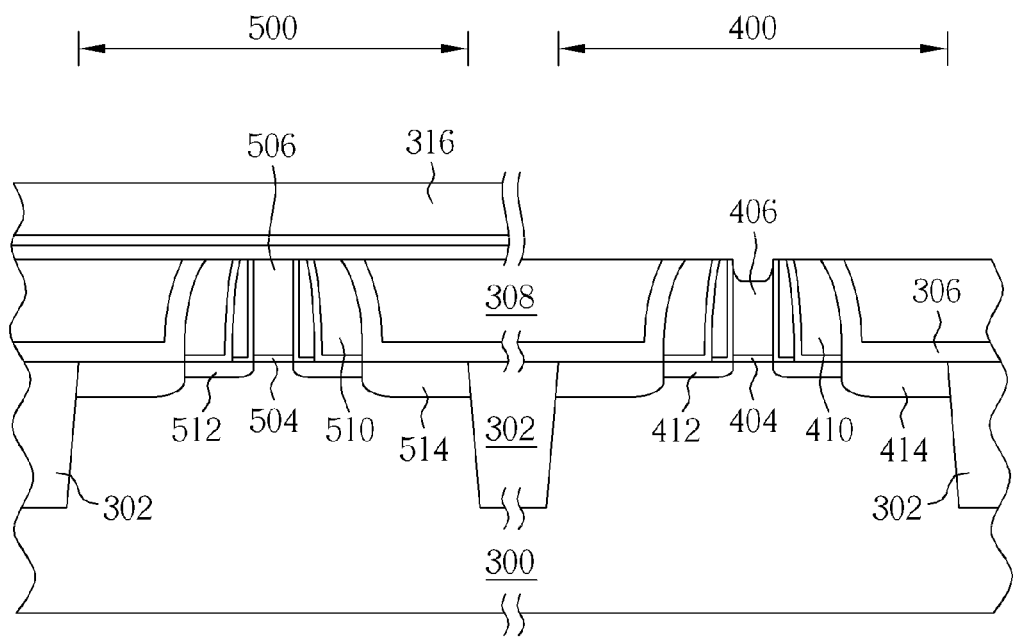
Figure 4B:
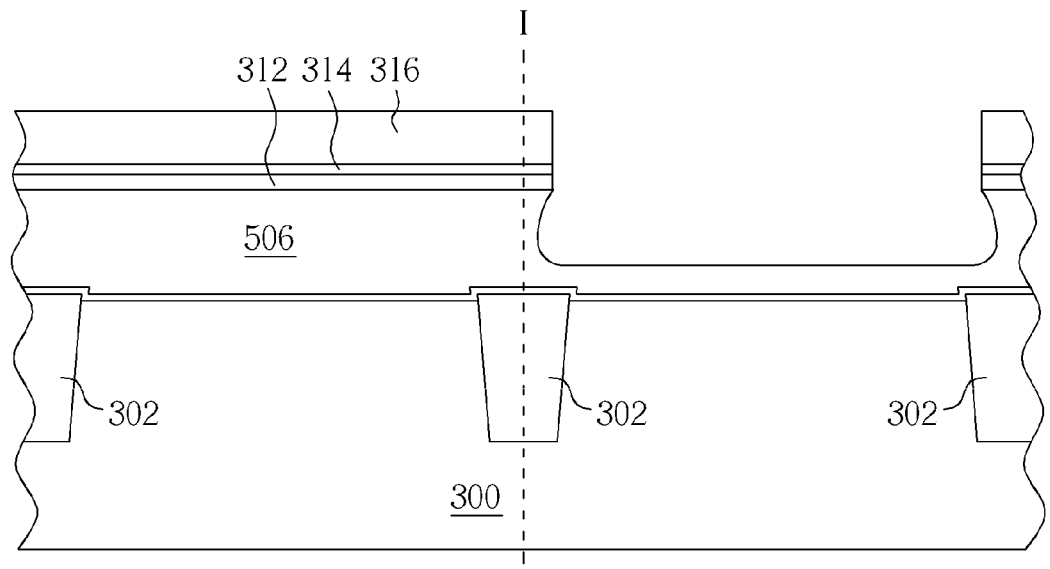
Figure 5:
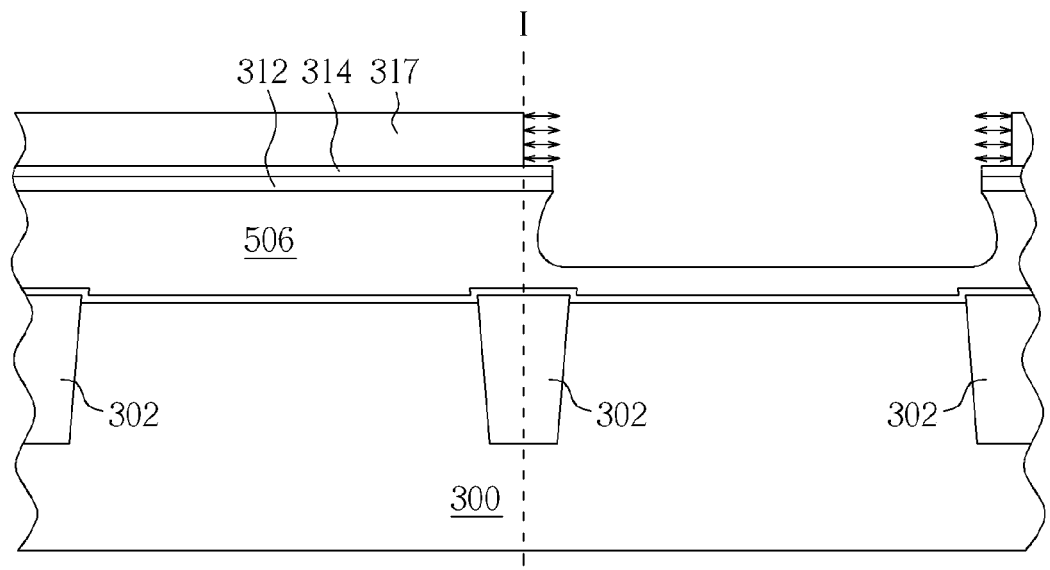

As shown in FIG. 4a and FIG. 4b, a dry etching step is performed to remove the mask layer 316, the auxiliary layer 312 and a part of the first sacrifice gate 406 not covered by the first patterned photoresist layer 316. As shown in FIG. 5, trimmed process is performed toward the first patterned photoresist layer 316. For example, by using $O_2$, $O_3$, $CF_4$, HBr or other plasma gas, the sidewall of the first patterned photoresist layer 316 is trimmed, and the width of the first patterned photoresist layer 316 is slightly reduced. The first patterned photoresist layer 316 evenly shrinks inwardly to form a second patterned photoresist layer 317. It is understood that, from a top view of the embodiment, the covering area of the second patterned photoresist layer 317 is smaller than that of the first patterned photoresist layer 316. Subsequently, as shown in FIG. 6, the second patterned photoresist layer 317 is used as a mask to remove the mask layer 312 and the auxiliary layer 314 not covered by the second patterned photoresist layer 317. Lastly, as shown in FIG. 7a and FIG. 7b, a wet etch is performed to completely remove the first sacrifice gate 406. As shown in FIG. 7a, after removing the first sacrifice gate 406, a first trench 416 is formed in the first conductive type transistor 402, and as shown in FIG. 7b, the poly-silicon sidewall is formed accurately near the dashed line I.

Figure 8:
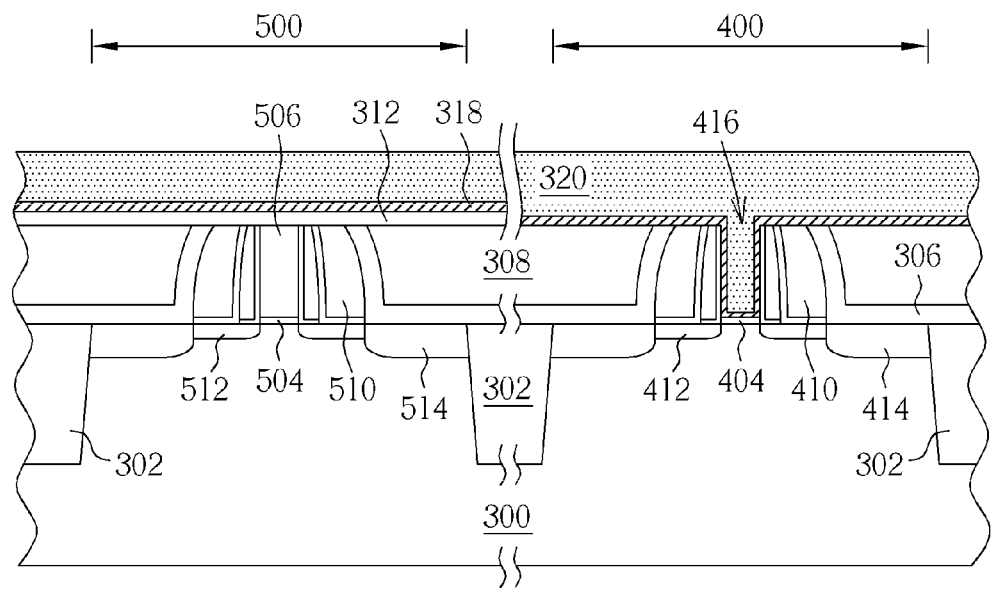

After removing the first sacrifice gate 406 to form the first trench 416, as shown in FIG. 8, a first metal layer 318 and a first material layer 320 are formed on the substrate 300. The first metal layer 318 is conformally formed on the surface of the first trench 416 but is not completely filled into the first trench 416, and the first material layer 320 is formed on the first metal layer 318 and is filled into the first trench 416. In the present embodiment, the first metal layer 318 serves as a work function metal required by a P-type transistor including titanium nitride (TiN) or tantalum carbide (TaC). The first material layer 320 serves an organic sacrifice layer with good filling capability, for example, a spin-on-polymer layer, a bottom anti-reflective coating (BARC) layer, a carbon containing dielectric layer, a sacrificial light absorbing material (SLAM) or a photoresist layer, but should not limited thereto.

Figure 9:
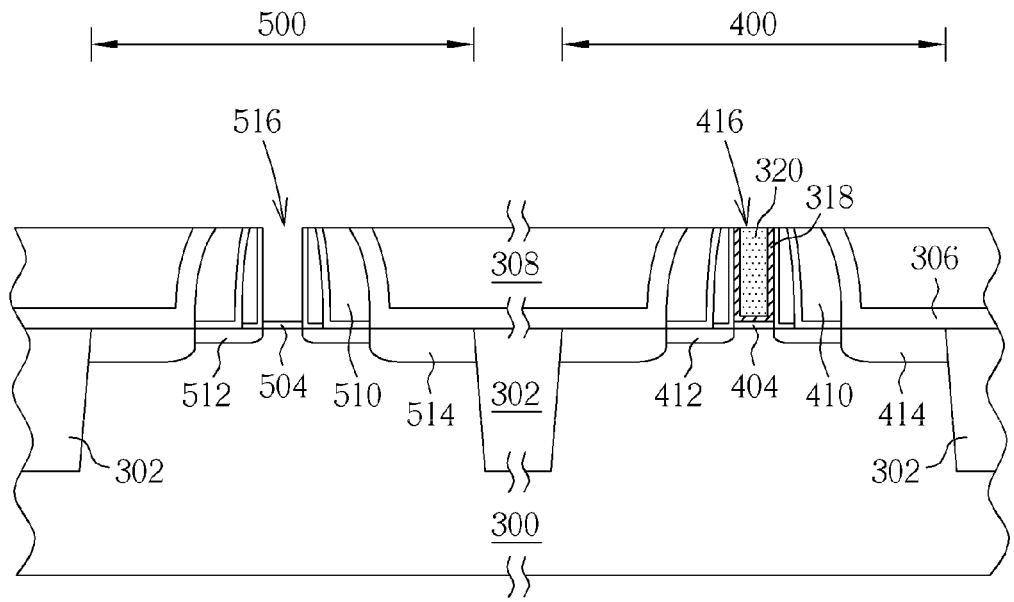

As shown in FIG. 9, a planarization process, such as a CMP process or an etching-back process or their combination is performed to remove the first material layer 320, the first metal layer 318 and the mask layer 312 above the ILD layer 308, until the second sacrifice gate 506 of the second conductive type transistor gate 502 is exposed. Next, the second sacrifice gate 506 of the second conductive type transistor gate 502 is removed to form a second trench 516 in the second active region 506. It should be noted that, in the present embodiment, since the first trench 416 has been filled with the first material layer 320 when removing the second sacrifice gate 506, there is no need to further form another photoresist layer to protect the first conductive type transistor 402. Instead, an etching process can be directly performed to remove the second sacrifice gate 506.

Figure 10:
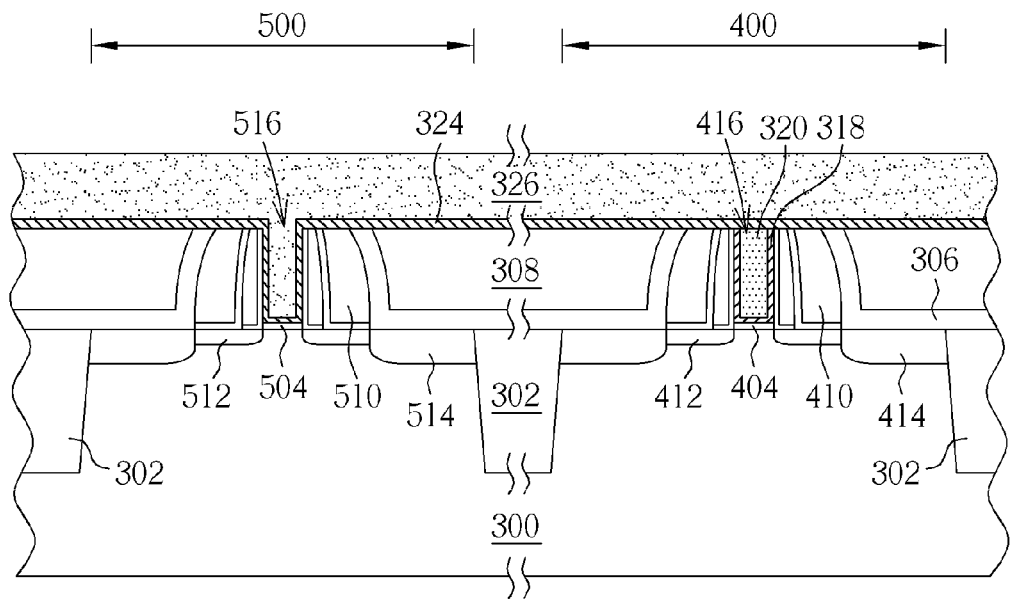

As shown in FIG. 10, a second metal layer 324 and a second material layer 326 are formed on the substrate 300. The second metal layer 324 is conformally formed on the surface of the second trench 516 but is not completely filled into the second trench 516, and the second material layer 326 is formed on the second metal layer 324 and is filled into the second trench 516. In one preferred embodiment of the present invention, the second metal layer 324 serves as a work function metal required by an n-type transistor including titanium aluminides (TiAl), aluminum zirconium (ZrAl), aluminum tungsten (WAl), aluminum tantalum (TaAl) or aluminum hafnium (HfAl), but should not be limited thereto. The second material layer 326 includes a spin-on-polymer layer, a bottom anti-reflective coating (BARC) layer, a carbon containing dielectric layer, a sacrificial light absorbing material (SLAM) or a photoresist layer, and the material of the second material layer 326 can be the same or can not be the same as the material of the first material layer 320.

Figure 11:
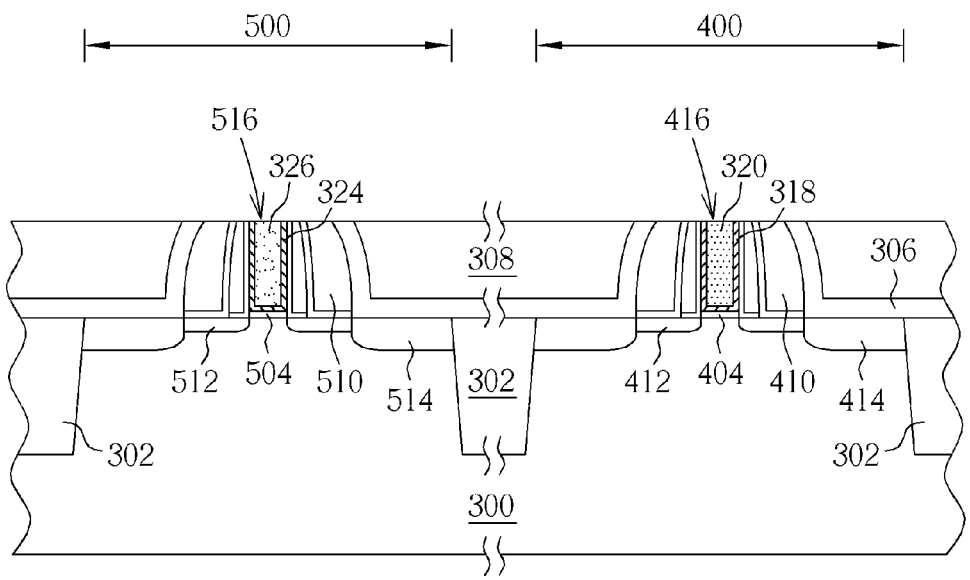

A shown in FIG. 11, a planarization process, such as a CMP process or an etching-back process is performed to remove the second metal layer 324 and the second material layer 326 above the ILD layer 308, until the first material layer 320 in the first trench 416 and the second material layer 326 in the second trench 326 are exposed. Then, the first material layer 320 in the first trench 416 and the second material layer 326 in the second trench 326 are removed. At this time, a U-shape first metal layer 318 and a U-shape second metal layer 324 are disposed on the surface of the first trench 416 and the second trench 516, respectively.

Figure 12:
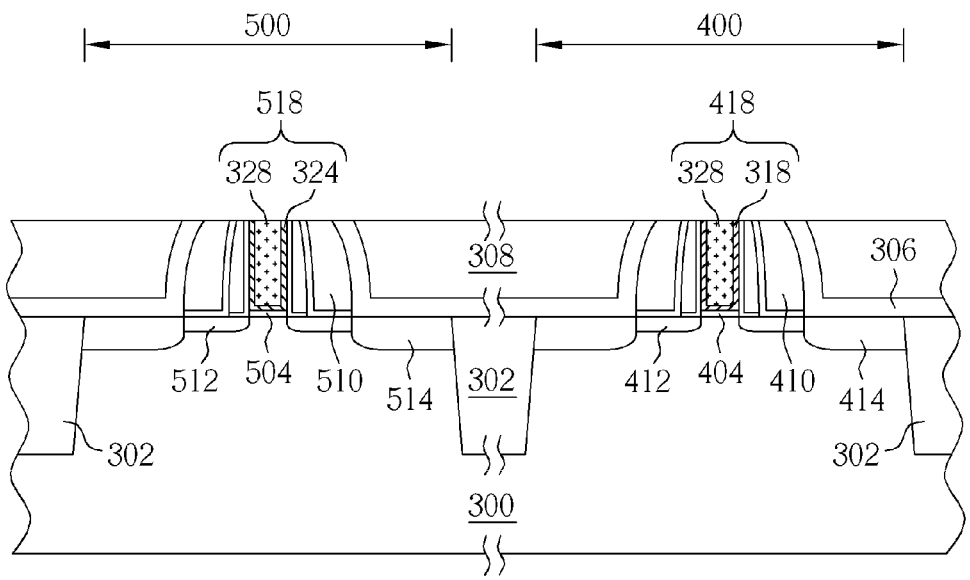

Lastly, as shown in FIG. 12, a low-resistance third conductive layer 328 is formed on the substrate 300 to at least fill into the first trench 416 and the second trench 516. In one preferred embodiment, the third conductive layer 328 includes a metal such as Al, Ti, Ta, W, Nb, Mo, TiN, TiC, TaN, Ti/W, or Ti/TiN. In another embodiment, the third conductive layer 328 includes carbon nanotube. A planarization process is performed to remove the third conductive layer 328 above the ILD layer 308. Thus, the first metal layer 320 and the third conductive layer 328 in the first trench 416 together form a first metal gate 418 of the first conductive type transistor 402 (P-type transistor), which has a work function substantially between 4.8 eV and 5.2 eV. The second metal layer 324 and the third conductive layer 328 in the second trench 518 together form a second metal gate 518 of the second conductive type transistor 502 (N-type transistors) which has a work function substantially between 3.9 eV and 4.3 eV.

After finishing the first metal gate 418 and the second metal gate 518, a contact plug forming process can be carried out. In another embodiment, before forming the contact plug, the ILD layer 306 and the CESL 308 can be removed completely. Then, another CESL (not shown) can be formed on the substrate 300. By applying a UV or a heat energy, the new CSEL can generate a stress to form a selective strain scheme (SSS), thereby enhancing the efficiency of the first conductive type transistor 402 and the second conductive type transistor 502. Another ILD layer (not shown) is then formed and at least a contact plug having appropriate stress can be formed therein.

Figure 13:
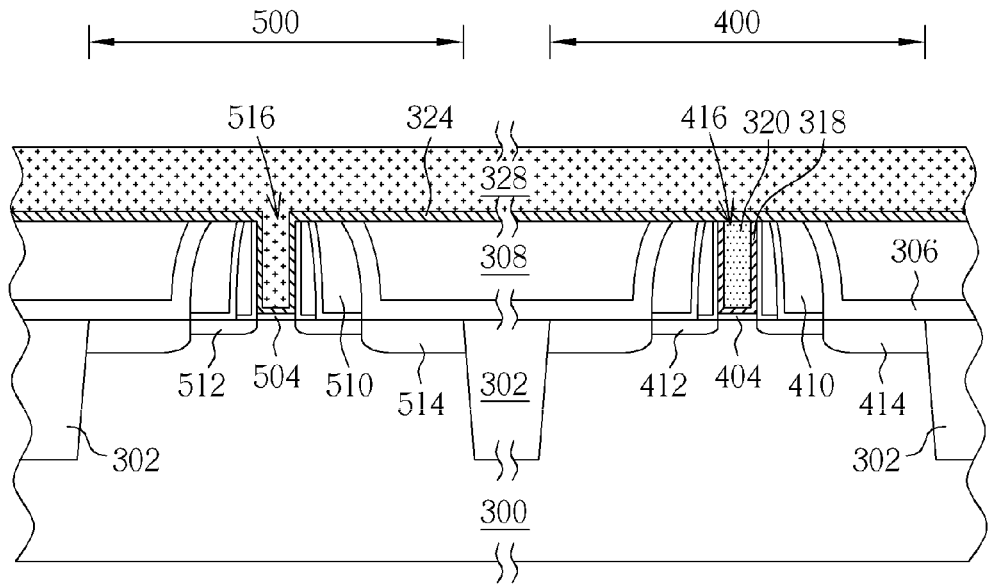
FIG. 13 to FIG. 15 illustrate the schematic diagrams of the method of manufacturing the semiconductor device having metal gate according to the second embodiment of the present invention.
Figure 14:
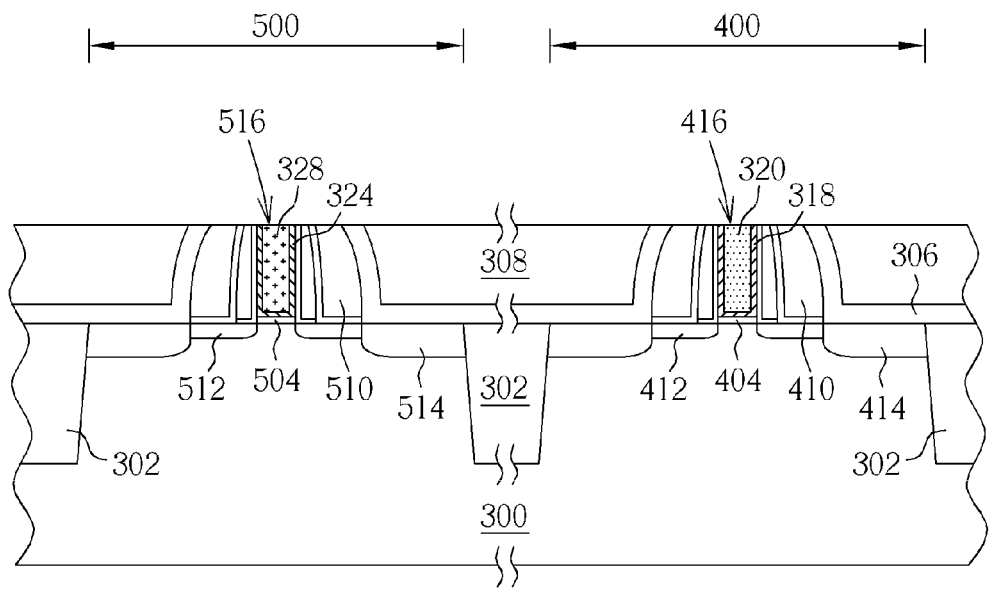
Figure 15:
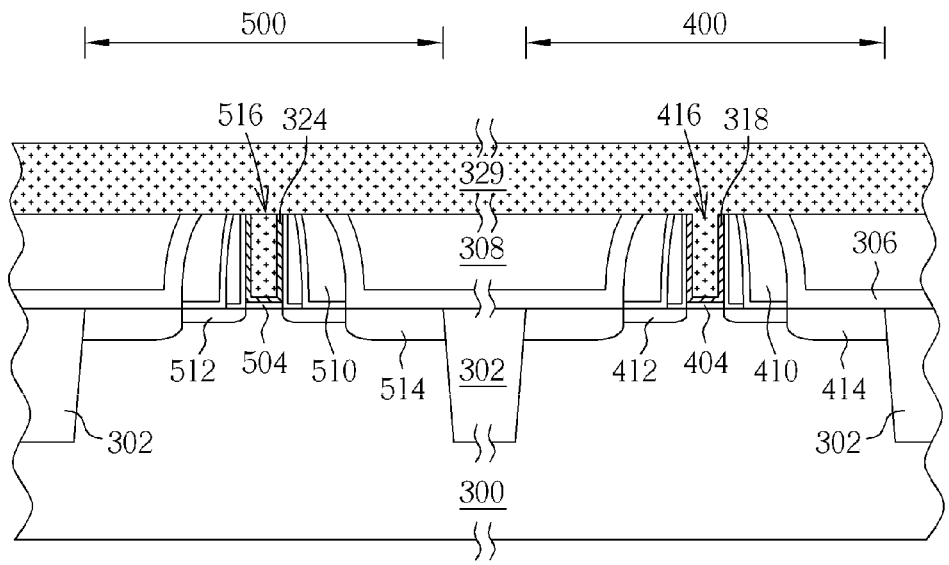
Figure 16:
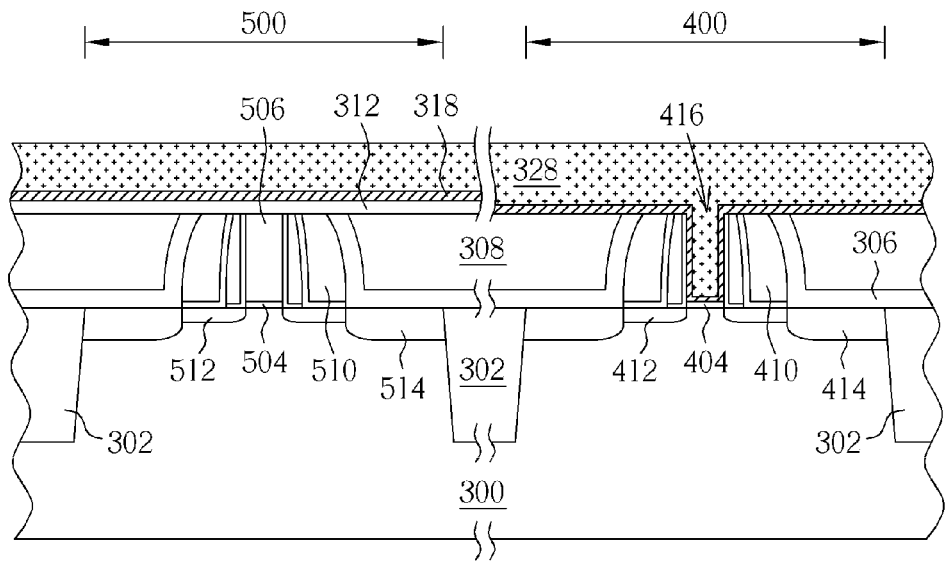
FIG. 16 to FIG. 19 illustrate the schematic diagrams of the method of manufacturing the semiconductor device having metal gate according to the third embodiment of the present invention.

Please refer to FIG. 13 to FIG. 15, illustrating the schematic diagrams of the method of manufacturing the semiconductor device having metal gate according to the second embodiment of the present invention. The former steps of the second embodiment are similar to those in FIG. 1 to FIG. 9 of the first embodiment and repeated descriptions are omitted. After the step of forming the second trench 516 as shown in FIG. 9, a second metal layer 324 and a third conductive layer 328 are formed on the substrate 300. The second metal layer 324 is formed on the surface of the second trench 516 and the third conductive 328 is filled into the second trench 516. The materials of the second metal layer 324 and the third conductive layer 328 are similar to those in the first embodiment, and are not described repeatedly.

As shown in FIG. 14, a planarization process is performed to remove the second metal layer 324 and the third conductive layer 328 above the ILD layer 308, until the first material layer 320 in the first trench 416 is exposed.

After removing the first material layer 320 in the first trench 416, as shown in FIG. 15, a fourth conductive layer 329 is formed on the substrate 300 to at least fill into the first trench 416. In one preferred embodiment, the fourth conductive layer 329 includes a metal such as Al, Ti, Ta, W, Nb, Mo, TiN, TiC, TaN, Ti/W, or Ti/TiN. In another embodiment, the fourth conductive layer 329 includes carbon nanotube. Preferably, the third conductive layer 328 and the fourth conductive layer 329 have the same material. Then, a planarization process is performed to remove the fourth conductive layer 329 above the ILD layer 308 and the structure similar to that in FIG. 12 including the first conductivity type transistor 402 having the first metal gate 418 and a second conductive type transistor 502 having a second metal gate 518 can be obtained.

Please refer to FIG. 16 to FIG. 19, illustrating the schematic diagrams of the method of manufacturing the semiconductor device having metal gate according to the third embodiment of the present invention. The former steps of the third embodiment are similar to those in FIG. 1 to FIG. 7a of the first embodiment and the repeated descriptions are omitted. After forming the first trench 416 as shown in FIG. 7a, please refer to FIG. 16, a first metal layer 318 and a third conductive layer 328 are formed on the substrate 300. The first metal layer 318 is conformally formed on the surface of the first trench 416, and the third conductive layer 328 is filled into the first trench 416. The materials of the first metal layer 318 and the third conductive layer 328 are similar to those in the first embodiment, and are not described repeatedly.

Figure 17:
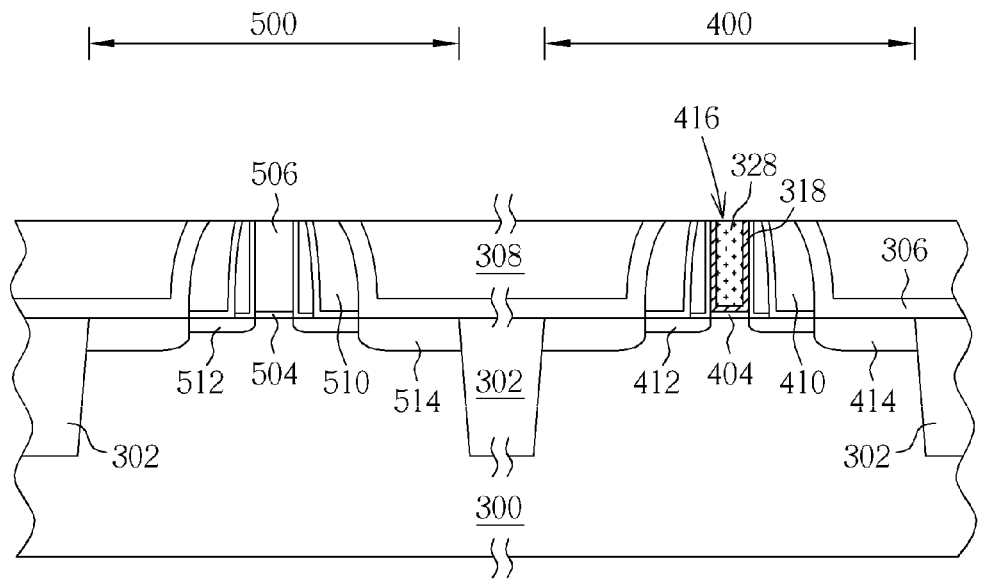
Figure 18:
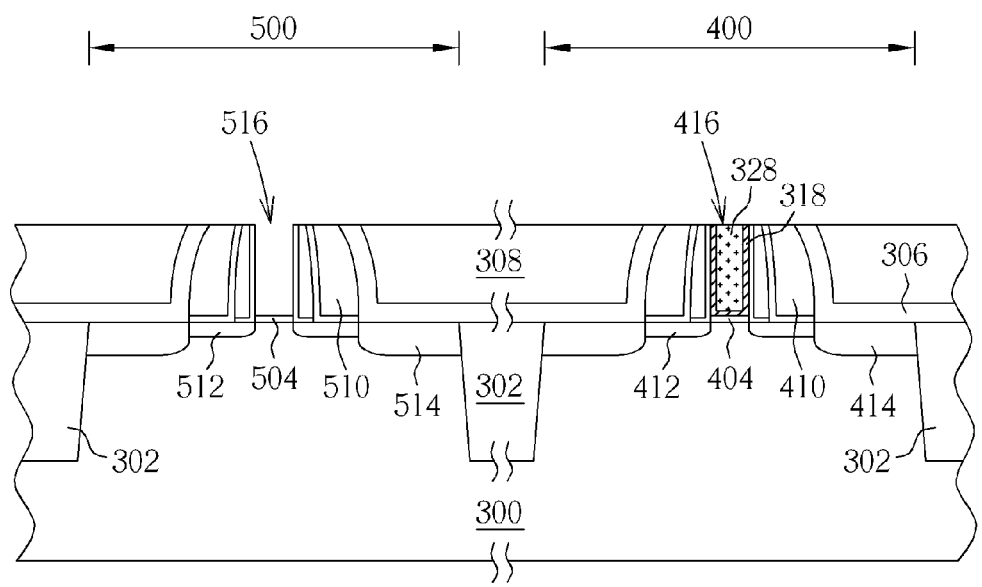

As shown in FIG. 17, a planarization process, such as a CMP process is performed to remove the third conductive layer 328, the first metal layer 318 and the mask layer 312 above the ILD layer 308 to expose the second sacrifice gate 506 of the second conductive type transistor gate 506. As shown in FIG. 18, the second sacrifice gate 506 of the second conductive type transistor 506 is removed to form a second trench 516 in the second active region 500. It is one germane feature of the present embodiment that only a wet etching step is performed to remove the second sacrifice gate 506. The wet etching step includes using a strong alkaline solution containing, for example, ozone and 1 to 4% tetramethylammonium hydroxide (TMAH), by volume in deionized water. Comparing to the dry etching process to remove the second sacrifice gate 506 in conventional arts, the damage to the first conductive type transistor 402 or the second conductive type transistor 502 can be reduced in the present invention.

Figure 19:
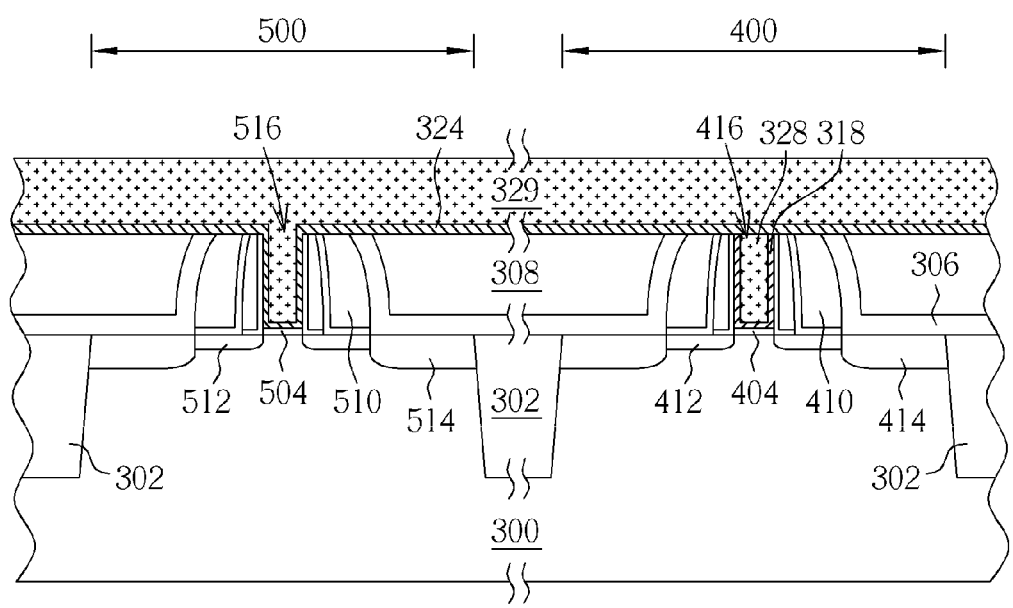

As shown in FIG. 19, a second metal layer 324 and a fourth conductive layer 329 are formed on the substrate 300. The second metal layer 324 and the fourth conductive layer 329 are filled into the second trench 516. The materials of the second metal layer 324 and the fourth conductive layer 329 are similar to those in the first embodiment, and are not described repeatedly. A planarization process, such as a CMP process is performed to remove the second metal layer 324 and the fourth conductive layer 329 above the ILD layer 308, and the structure similar to that shown in FIG. 12 including the first conductivity type transistor 402 having the first metal gate 418 and a second conductive type transistor 502 having a second metal gate 518 can be obtained.

It should be noted that the above methods present forming the high-k gate dielectric layer at first (high-K first). However, those skilled in the art can realize that, in the present invention, it is also available to remove the gate dielectric layer and then form another U-shaped high-k gate dielectric layer after removing the sacrifice gate (high-K last). For example, the first gate dielectric layer 404 can be removed and then an U-shaped high-K gate dielectric layer can be formed on the surface of the first trench 416 before forming the first metal layer 318. Similarly, it is also available to remove the first gate dielectric layer 404 and then form an U-shaped high-K gate dielectric layer on the surface of the second trench 516 before forming the second metal layer 324.

In summary, the present invention provides a method of manufacturing a semiconductor device having a metal gate. Comparing to conventional methods that use two different masks to respectively remove the first sacrifice gate and the second sacrifice gate, in the present invention, when removing the second sacrifice gate, the first trench has been filled with a material layer or a metal layer (see FIG. 9 and FIG. 18). Consequently, the second sacrifice gate can be directly removed without another patterned photoresist layer to protect the components in the first trench, thus only one lithography process is required in the present invention. In addition, since organic material is employed as the first material layer or the second material layer in the first embodiment or the second embodiment, and due to the good filling capability and the property of being removed easily by a CMP or an etching process, it is suitable for the organic material to serve as the sacrifice filling layer into the first trench or the second trench. When removing the organic material in the first trench or the second trench, the third conductive layer is filled into the first trench and the second trench to form the metal gate, thereby forming a metal gate structure with good reliability. Further, the present invention provides special processes to form the first trench and the second trench. For example, a photoresist trimmed process is applied to form the first trench while a wet etching process is applied to form the second trench. By the above mentioned methods, the reliability of the method can be raised.

Those skilled in the art will readily observe that numerous modifications and alterations of the device and method may be made while retaining the teachings of the invention.

What is claimed is:

1. A method of manufacturing a semiconductor device having metal gate, comprising:
    providing a substrate, wherein a first conductive type transistor and a second conductive type transistor are disposed on the substrate, and the first conductive type transistor comprises a first sacrifice gate and the second conductive type transistor comprises a second sacrifice gate;
    removing the first sacrifice gate of the first conductive type transistor to form a first trench;
    forming a first metal layer and a first material layer in the first trench;
    simultaneously planarizing the first metal layer and the first material layer outside the first trench;
    after planarizing the first metal layer and the first material layer, removing the second sacrifice gate of the second conductive type transistor to form a second trench without using a mask layer;
    forming a second metal layer and a second material layer in the second trench; and
    planarizing the second metal layer and the second material layer.

2. The method of manufacturing a semiconductor device having metal gate according to claim 1, wherein the first metal layer comprises TiN or TaC.

3. The method of manufacturing a semiconductor device having metal gate according to claim 1, wherein the second metal layer comprises TiAl, ZrAl, WAl, TaAl or HfAl.

4. The method of manufacturing a semiconductor device having metal gate according to claim 1, wherein the first material layer comprises a spin-on-polymer layer, a bottom anti-reflective coating (BARC) layer, a carbon containing dielectric layer, a sacrificial light absorbing material (SLAM) or a photoresist layer.

5. The method of manufacturing a semiconductor device having metal gate according to claim 4, wherein the second material layer comprises a spin-on-polymer layer, a bottom anti-reflective coating (BARC) layer, a carbon containing dielectric layer, a sacrificial light absorbing material (SLAM) or a photoresist layer.

6. The method of manufacturing a semiconductor device having metal gate according to claim 5, after planarizing the second metal layer and the second material layer, further comprising:
    removing the first material layer in the first trench and the second material layer in the second trench;
    forming a third conductive layer in the first trench and the second trench; and
    planarizing the third conductive layer.

7. The method of manufacturing a semiconductor device having metal gate according to claim 6, wherein the third metal layer comprises Al, Ti, Ta, W, Nb, Mo, TiN, TiC, TaN, Ti/W, Ti/TiN or carbon nanotube.

8. The method of manufacturing a semiconductor device having metal gate according to claim 1, wherein the first material layer comprises a spin-on-polymer layer, a bottom anti-reflective coating (BARC) layer, a carbon containing dielectric layer, a sacrificial light absorbing material (SLAM) or a photoresist layer.

9. The method of manufacturing a semiconductor device having metal gate according to claim 8, wherein the second material layer comprises Al, Ti, Ta, W, Nb, Mo, TiN, TiC, TaN, Ti/W, Ti/TiN or carbon nanotube.

10. The method of manufacturing a semiconductor device having metal gate according to claim 9, after planarizing the second metal layer and the second material layer, further comprising:
removing the first material layer in the first trench;
forming a third conductive layer in the first trench; and
planarizing the third conductive layer.

11. The method of manufacturing a semiconductor device having metal gate according to claim 10, wherein the third metal layer comprises Al, Ti, Ta, W, Nb, Mo, TiN, TiC, TaN, Ti/W, Ti/TiN or carbon nanotube.

12. The method of manufacturing a semiconductor device having metal gate according to claim 1, wherein the first material layer comprises Al, Ti, Ta, W, Nb, Mo, TiN, TiC, TaN, Ti/W, Ti/TiN or carbon nanotube.

13. The method of manufacturing a semiconductor device having metal gate according to claim 12, wherein the second material layer comprise Al, Ti, Ta, W, Nb, Mo, TiN, TiC, TaN, Ti/W, Ti/TiN or carbon nanotube.

14. The method of manufacturing a semiconductor device having metal gate according to claim 1, wherein the step of removing the second sacrifice gate of the second conductive type transistor comprises a wet etching step.

15. The method of manufacturing a semiconductor device having metal gate according to claim 1, wherein the step of removing the second sacrifice gate of the second conductive type transistor consist of a wet etching step.

16. The method of manufacturing a semiconductor device having metal gate according to claim 15, wherein the wet etching step comprises using a solution with ozone and 1 to 4% TMAH by volume.

17. The method of manufacturing a semiconductor device having metal gate according to claim 1, wherein the step of removing the first sacrifice gate of the first conductive type transistor comprises:
forming a mask layer;
forming a first patterned photoresist layer to cover the second conductive type transistor; and
removing the first sacrifice gate and the mask layer not covered by the first patterned photoresist layer.

18. The method of manufacturing a semiconductor device having metal gate according to claim 17, further comprising forming an auxiliary layer on the mask layer, wherein the auxiliary layer comprises $SiO_2$.

19. The method of manufacturing a semiconductor device having metal gate according to claim 17, further comprising:
performing a trimmed process toward the first patterned photoresist layer to form a second patterned photoresist layer, wherein the width of the second patterned photoresist layer is substantially less than that of the first patterned photoresist layer;
removing the portions of the mask layer and the first sacrifice gate not covered by the second patterned photoresist layer;
removing the second patterned photoresist layer; and
performing a wet etching process to completely remove the first sacrifice gate.

20. The method of manufacturing a semiconductor device having metal gate according to claim 19, wherein the trimmed process uses a plasma gas comprising $O_2$, $O_3$, $CF_4$ or HBr.

* * * * *